United States Patent
Fanelli

(10) Patent No.: US 9,269,608 B2
(45) Date of Patent: Feb. 23, 2016

(54) BONDED SEMICONDUCTOR STRUCTURE WITH SIGEC/SIGEBC LAYER AS ETCH STOP

(71) Applicant: QUALCOMM SWITCH CORP., San Diego, CA (US)

(72) Inventor: Stephen A. Fanelli, San Marcos, CA (US)

(73) Assignee: QUALCOMM SWITCH CORP., San Diego, CA (US)

(*) Notice: Subject to any disclaimer, the term of this patent is extended or adjusted under 35 U.S.C. 154(b) by 0 days.

(21) Appl. No.: 14/673,309

(22) Filed: Mar. 30, 2015

(65) Prior Publication Data

US 2015/0270161 A1    Sep. 24, 2015

Related U.S. Application Data

(63) Continuation-in-part of application No. 14/223,060, filed on Mar. 24, 2014, now Pat. No. 9,105,689.

(51) Int. Cl.
*H01L 21/30* (2006.01)
*H01L 21/46* (2006.01)
*H01L 21/762* (2006.01)
*H01L 29/78* (2006.01)

(52) U.S. Cl.
CPC ...... *H01L 21/76256* (2013.01); *H01L 29/7849* (2013.01)

(58) Field of Classification Search
CPC ..... H01L 21/306; H01L 21/465; H01L 21/30; H01L 31/108; H01L 27/14649; H01L 29/47
USPC ........... 438/455, 598, 599; 257/347, E21.122
See application file for complete search history.

(56) References Cited

U.S. PATENT DOCUMENTS

| 5,906,708 | A | 5/1999 | Robinson et al. | |
| 6,323,108 | B1 | 11/2001 | Kub et al. | |
| 6,815,278 | B1* | 11/2004 | Ieong et al. | 438/198 |
| 7,268,063 | B1* | 9/2007 | Quick et al. | 438/487 |
| 7,282,753 | B2 | 10/2007 | Kub et al. | |
| 7,547,930 | B2 | 6/2009 | Chu | |
| 7,977,145 | B2 | 7/2011 | Hannebauer | |
| 8,466,036 | B2 | 6/2013 | Brindle et al. | |

(Continued)

FOREIGN PATENT DOCUMENTS

WO    2013019250 A1    2/2013

OTHER PUBLICATIONS

International Search Report and Written Opinion dated Jun. 18, 2015 for PCT Patent Application No. PCT/US2015/21243.

*Primary Examiner* — Phuc Dang
(74) *Attorney, Agent, or Firm* — Haynes and Boone LLP

(57) ABSTRACT

A semiconductor structure is formed with a first wafer (e.g. a handle wafer) and a second wafer (e.g. a bulk silicon wafer) bonded together. The second wafer includes an active layer, which in some embodiments is formed before the two wafers are bonded together. A substrate is removed from the second wafer on an opposite side of the active layer from the first wafer using a SiGeC or SiGeBC layer as an etch stop. In some embodiments, the SiGeC or SiGeBC layer is formed by epitaxial growth, ion implantation or a combination of epitaxial growth and ion implantation.

20 Claims, 3 Drawing Sheets

(56) References Cited

U.S. PATENT DOCUMENTS

| | | |
|---|---|---|
| 2005/0156246 A1 | 7/2005 | Lochtefeld et al. |
| 2006/0172505 A1* | 8/2006 | Koester et al. ............ 438/455 |
| 2006/0199353 A1 | 9/2006 | Kub et al. |
| 2008/0213973 A1* | 9/2008 | Dao ............................ 438/458 |
| 2011/0230030 A1 | 9/2011 | Souza et al. |
| 2012/0146193 A1 | 6/2012 | Stuber et al. |
| 2013/0280884 A1 | 10/2013 | Brindle et al. |
| 2014/0030871 A1 | 1/2014 | Arriagada et al. |

\* cited by examiner

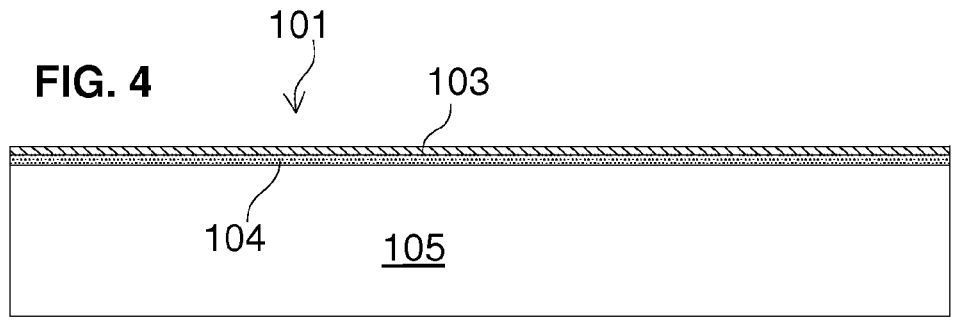
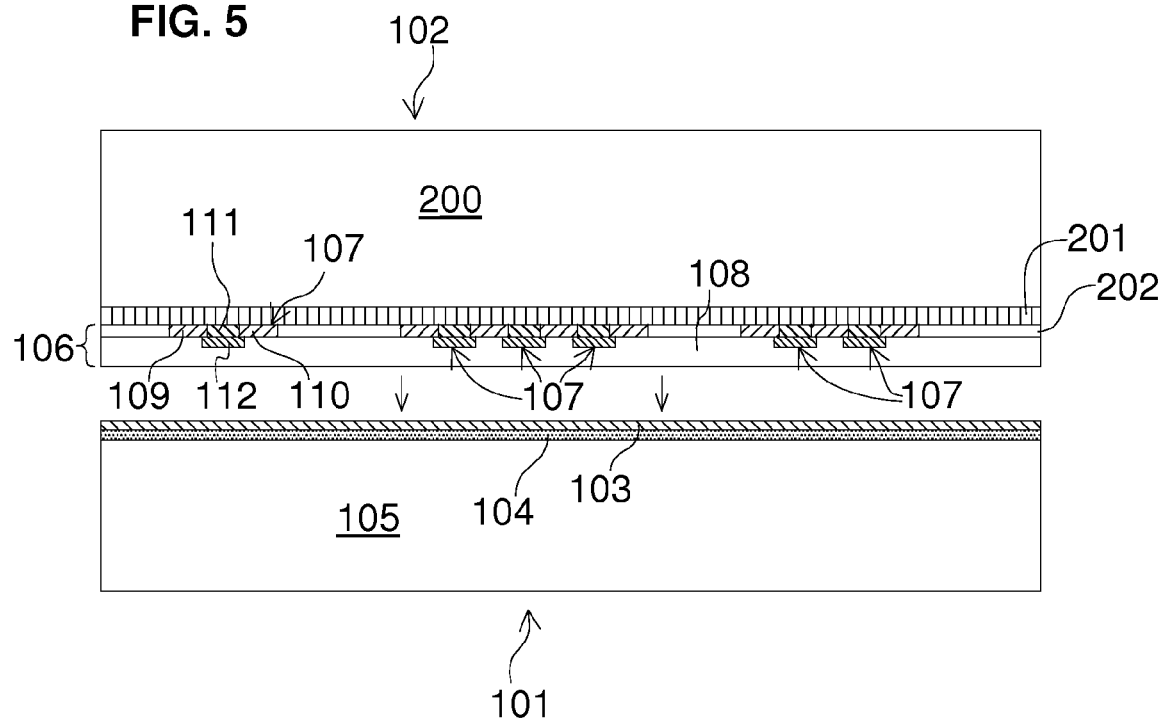

BONDED SEMICONDUCTOR STRUCTURE WITH SIGEC/SIGEBC LAYER AS ETCH STOP

CROSS-REFERENCE TO RELATED APPLICATIONS

This application is a continuation-in-part of U.S. application Ser. No. 14/223,060, filed Mar. 24, 2014, which is hereby incorporated by reference herein in its entirety.

BACKGROUND OF THE INVENTION

Layer transfer, or wafer bonding, techniques may be used to form the layers of a semiconductor-on-insulator (SOI) wafer having a bulk substrate layer, a buried oxide (BOX) layer, and a semiconductor layer. Integrated circuits (ICs) with active devices and conductive interconnects can then be formed into and onto the semiconductor layer.

An alternative layer transfer process may start with an SOI wafer (having an active device layer already formed), invert the SOI wafer, bond the SOI wafer to a handle wafer, and then remove the bulk substrate and the BOX. In this manner, the active device layer is transferred to the handle wafer. Additionally, the handle wafer may have previously undergone other processing, so that the resulting bonded semiconductor structure may have desirable features that are difficult to achieve in a single wafer subjected to all of the necessary processing steps. For example, the handle wafer may have a substrate with a trap rich layer, so that the resulting semiconductor structure has the trap rich layer between the active device layer and the substrate. However, if a single wafer had been used, and the trap rich layer had been formed in the wafer before the active device layer, then the processing techniques used to form the active device layer could have degraded the trap rich layer. In this example, therefore, the layer transfer process involving separately processed wafers enables a better final product.

In some respects, or for some applications, the development of SOI technology represented an advance over traditional bulk semiconductor processes. However, SOI wafers are generally more complex and expensive than simple bulk semiconductor wafers. Part of the added expense is due to additional processing steps required to produce the SOI wafers before active device fabrication can begin.

SUMMARY OF THE INVENTION

In some embodiments, a semiconductor structure is formed with a first wafer (e.g. a handle wafer) and a second wafer (e.g. a bulk silicon wafer) bonded together. The second wafer includes a substrate, a SiGeC (silicon-germanium-carbon) or SiGeBC (silicon-germanium-boron-carbon) layer, and an active layer. The substrate is removed from the second wafer on an opposite side of the active layer from the first wafer using the SiGeC or SiGeBC layer as an etch stop. In some embodiments, the SiGeC or SiGeBC layer is formed by epitaxial growth, ion implantation or a combination of epitaxial growth and ion implantation.

In some embodiments, the SiGeC or SiGeBC layer is then removed; but in some other embodiments, it remains as a strain-inducing layer. In some embodiments, the active layer and the SiGeC or SiGeBC layer are formed before the two wafers are bonded together. In some embodiments, the active layer includes a gate and a channel, and after the bonding of the second wafer to the first wafer the gate is between the channel and the first wafer. In some embodiments, the first wafer includes a trap rich layer.

BRIEF DESCRIPTION OF THE DRAWINGS

FIG. 4 is a simplified cross section diagram of a second wafer that may be used to form the semiconductor structure shown in FIG. 1 in accordance with an embodiment of the present invention.

FIGS. 5, 6, and 7 are simplified cross section diagrams at different stages of fabrication of the semiconductor structure shown in FIG. 1 in accordance with an embodiment of the present invention.

DETAILED DESCRIPTION OF THE INVENTION

Reference now will be made in detail to embodiments of the disclosed invention, one or more examples of which are illustrated in the accompanying drawings. Each example is provided by way of explanation of the present technology, not as a limitation of the present technology. In fact, it will be apparent to those skilled in the art that modifications and variations can be made in the present technology without departing from the spirit and scope thereof. For instance, features illustrated or described as part of one embodiment may be used with another embodiment to yield a still further embodiment. Thus, it is intended that the present subject matter covers all such modifications and variations within the scope of the appended claims and their equivalents.

Figure 1:
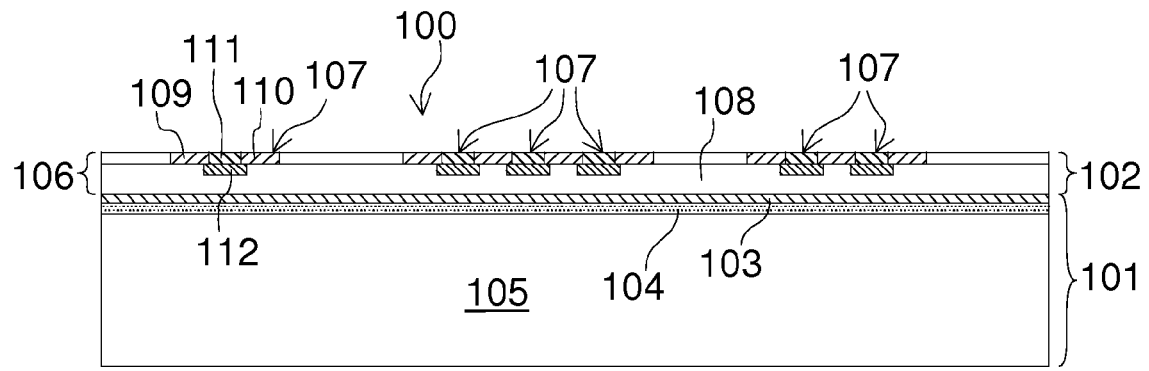
FIG. 1 is a simplified cross section diagram of a semiconductor structure in accordance with an embodiment of the present invention.

A semiconductor structure 100 is shown in FIG. 1 in accordance with an embodiment of the present invention. The semiconductor structure 100 may be incorporated into an overall IC chip (not shown). The semiconductor structure 100 generally includes a first wafer 101 and a remaining portion of a second wafer 102 that have been bonded together. In some embodiments, the first wafer 101 is a handle wafer that provides structural strength for the semiconductor structure 100. In some embodiments, the second wafer 102 is a bulk semiconductor wafer, rather than a semiconductor-on-insulator (SOI) wafer. Since the second wafer 102 may be a bulk semiconductor wafer, the initial cost of the second wafer 102, prior to CMOS processing, is generally less than that of an SOI wafer. Additionally, since the standard substrate and buried oxide (BOX) of an SOI wafer would have to be removed to form a structure comparable to the remaining portion of the second wafer 102, it is unnecessary to start with an SOI wafer to form the semiconductor structure 100. Therefore, an advantage of the present invention is that a cheaper bulk semiconductor wafer may be used for the second wafer 102. Additional advantages will become apparent in the following description.

The first wafer 101 generally includes a bonding layer 103, a trap rich layer 104, and a substrate layer 105. Additional components may also be incorporated into the first wafer 101, but are not shown for simplicity.

The remaining portion of the second wafer 102 generally includes at least an active layer 106. The active layer 106 generally includes active devices 107 and an insulator layer 108 therein. The active devices 107 generally include a source 109, a drain 110, a channel 111, and a gate 112. In some embodiments, the active layer 106 also includes a bonding layer. Alternatively, the insulator layer 108 (or at least a thin portion thereof at the outward surface) may serve as the bonding layer. Additional components may also be incorporated into the active layer 106, but are not shown for simplicity.

The trap rich layer 104 in the first wafer 101 effectively combats parasitic surface conduction because the trap rich layer 104 significantly degrades the carrier lifetimes of charge carriers in the trap rich layer 104. Since the carriers cannot travel far, therefore, the effective resistance of the substrate layer 105 is preserved and the capacitance as seen by the active layer 106 is not as dependent upon the signals in the active layer 106. The process described below for forming the semiconductor structure 100 generally preserves the efficacy of the trap rich layer 104 and minimizes disruption of the integrity of the overall IC chip of which the semiconductor structure 100 is a part.

Figure 2:
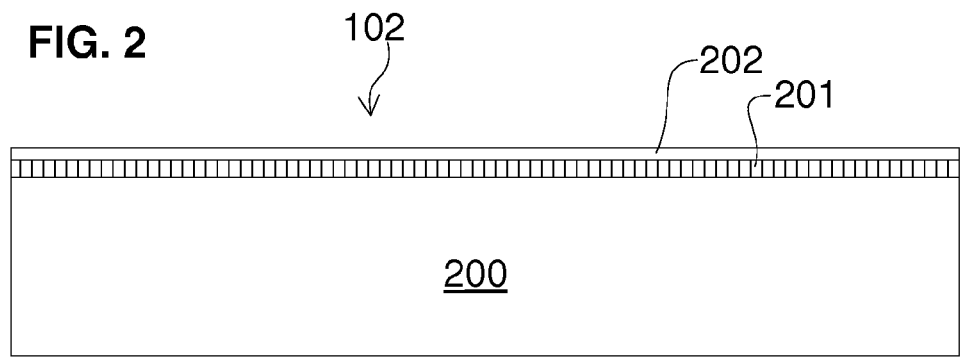
FIGS. 2 and 3 are simplified cross section diagrams at different stages of fabrication of a first wafer that may be used to form the semiconductor structure shown in FIG. 1 in accordance with an embodiment of the present invention.

A process in accordance with an embodiment of the present invention for forming the semiconductor structure 100 is described herein with reference to FIGS. 2-7. The second wafer 102 generally starts with a bulk semiconductor (e.g. silicon, etc.) substrate 200, as shown in FIG. 2. A silicon-germanium-carbon (SiGeC) or silicon-germanium-boron-carbon (SiGeBC) layer 201 and a semiconductor layer 202 are formed into or onto the bulk semiconductor substrate 200. The SiGeC/SiGeBC layer 201 may be epitaxially grown on the bulk semiconductor substrate 200 or ion implanted into the bulk semiconductor substrate 200 or formed by any other appropriate process. Additionally, the SiGeC/SiGeBC layer 201 may be formed by a combination of epitaxial growth and ion implantation. In some embodiments, an initial portion of the layer 201 is formed by implantation of any combination of some or all of the elements (Si, Ge, B and/or C) and a remaining portion of the layer 201 is formed by epitaxial growth. In some embodiments, a first portion of the layer 201 is formed by implantation with some or all of the elements listed above, a second portion is formed by epitaxial growth with some or all of the elements listed above, and a third portion is formed by another implant step with some or all of the elements listed above to complete the layer 201. In some embodiments, the semiconductor layer 202 may then be epitaxially grown on the SiGeC/SiGeBC layer 201. If the SiGeC/SiGeBC layer 201 is formed entirely by ion implantation, and the implantation is deep enough, then the semiconductor layer 202 may be (or be formed from) a portion of the bulk semiconductor substrate 200 above the implanted SiGeC/SiGeBC layer 201.

Figure 3:
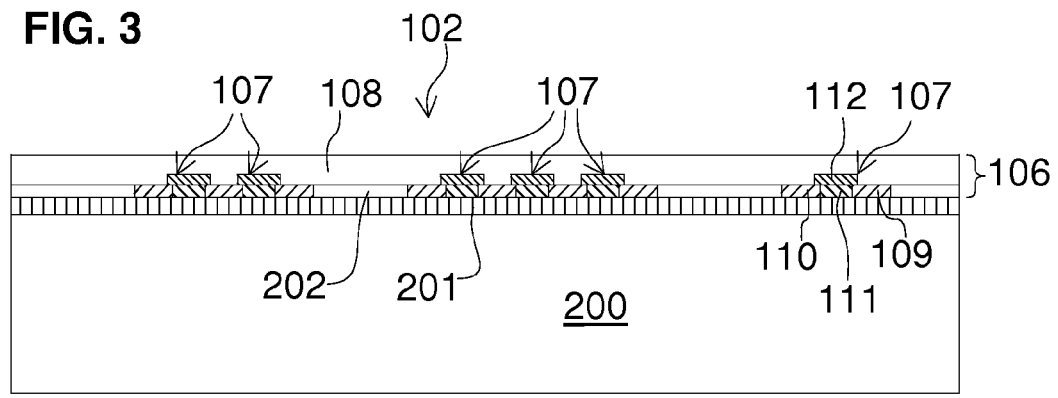

The active devices 107 and the insulator layer 108 are formed by CMOS processing into and onto the semiconductor layer 202 as shown in FIG. 3. In this manner, the active layer 106 is formed above the SiGeC/SiGeBC layer 201 with the channel 111 between the gate 112 and the SiGeC/SiGeBC layer 201. Additionally, in some embodiments, the surface of the insulator layer 108 is polished, or a bonding layer (not shown) is formed onto the insulator layer 108, in anticipation of later fusion bonding with the first wafer 101.

In a separate process, e.g. concurrently with any portion of the process generally shown in FIGS. 2 and 3 for forming the second wafer 102, the first wafer 101 is formed as shown in FIG. 4. The trap rich layer 104 and the bonding layer 103 may be formed in any appropriate manner, e.g. by any appropriate one or more of the processes described in U.S. Pat. No. 8,466,036, which is incorporated herein by reference as if fully set forth herein.

The second wafer 102 is inverted, as shown in FIG. 5, and bonded to the first wafer 101. Thus, the two wafers 101 and 102 are bonded face-to-face, i.e. with the insulator layer 108 at the front or top surface of the second wafer 102 bonded to the bonding layer 103 at the front or top surface of the first wafer 101. The gate 112 is thus between the channel 111 and the first wafer 101.

Figure 6:
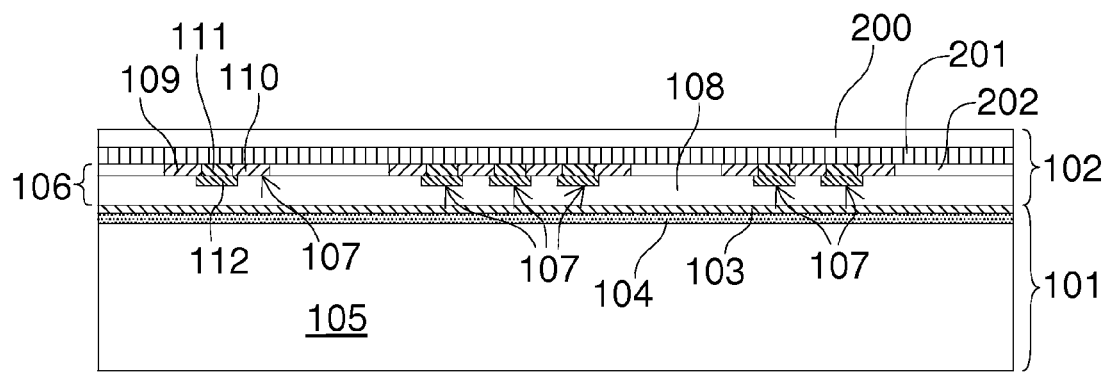
Figure 7:
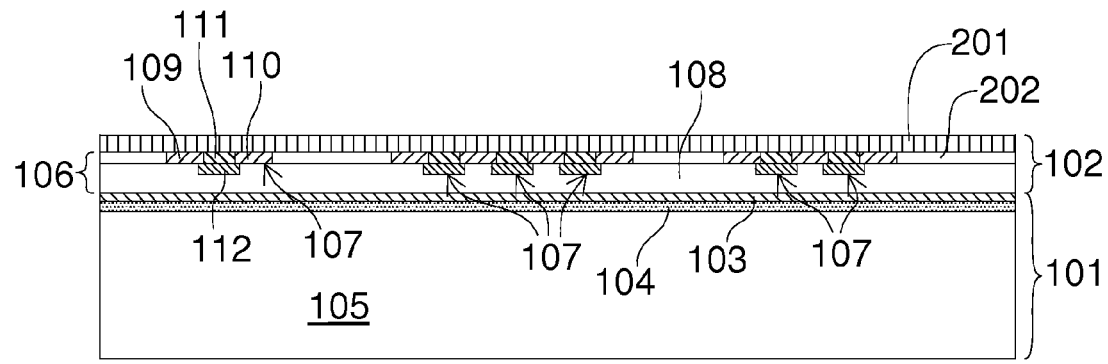

The bulk semiconductor substrate 200 is generally removed from the second wafer 102. This removal may be done in a two-step process. First, most of the bulk semiconductor substrate 200 is removed by grinding, as shown in FIG. 6. Then the remaining semiconductor material is removed, e.g. with a wet etch that is selective to the SiGeC/SiGeBC layer 201, as shown in FIG. 7. The SiGeC/SiGeBC layer 201, thus, serves as an etch stop layer. When the SiGeC/SiGeBC layer 201 is reached, the etch rate may decrease, allowing a complete or uniform removal of all the semiconductor material of the bulk semiconductor substrate 200.

The SiGeC/SiGeBC layer 201 may then be removed, e.g. by another wet etch, to form the semiconductor structure 100, as shown in FIG. 1. Alternatively, the SiGeC/SiGeBC layer 201 may remain as a strain inducing layer that induces strain in the channel 111. As a strain layer, the SiGeC/SiGeBC layer 201 would provide the advantage of increasing the mobility in the channel 111 and improving the performance of the overall IC. The benefits of the strain inducing layer would not be achieved with some other types of etch stop layers, e.g. a P+ etch stop layer.

The semiconductor structure 100 and the process that forms it generally enables the active layer 106 to be formed as a relatively thin layer. This process is contrasted with a process that uses an SOI wafer instead of the second wafer 102. In such a situation, the BOX of the SOI wafer may be used as an etch stop layer to remove the underlying substrate. The resulting structure would also potentially have a relatively thin active layer. However, the present invention does so with a less expensive bulk semiconductor wafer. Additionally, the process described above is contrasted with a process that uses a different type of etch stop, such as a P+ etch stop layer. In such a situation, the dopant in the P+ etch stop layer would be much less tolerant of the high temperatures used in CMOS processing. Thus, the P+ dopant could potentially diffuse within the semiconductor wafer during subsequent CMOS processing, thereby adding dopant to, and seriously changing the characteristics of, the source 109, the drain 110, and the channel 111. To avoid this problem with a P+ etch stop layer, the P+ etch stop layer would have to be formed much deeper into the bulk semiconductor substrate 200 or the semiconductor layer 202 would have to be much thicker. Either way, the active layer 106 could not be formed to be as thin as it can with the present invention.

In some embodiments, the active layer 106 could be made relatively thin with a polish stop process. This process may use a selective CMP to stop on STI (shallow trench isolation) regions patterned on the second wafer 102.

Another advantage of the present invention is related to the layer transfer process. A common application for etch stop layers is as part of a layer transfer process to create an SOI wafer before CMOS processing. However, if the SiGeC/SiGeBC etch stop layer is used to create an SOI wafer prior to CMOS processing, then the transferred film would have to be polished (e.g. CMP, etc.) smooth for subsequent processing. This process would be challenging and would likely result in a non-uniform active device layer with the CMP process. In some embodiments of the present invention, on the other hand, the SiGeC/SiGeBC layer 201 is first processed in the second wafer 102 and then layer transferred to a handle wafer (e.g. the first wafer 101). In other words, CMOS processing is done with the epi or implanted SiGeC/SiGeBC layer 201 and then layer transferred to a handle wafer toward the end of the process, i.e. after the active devices 107 are fabricated. The rough surface that is likely to exist on the second wafer 102 at the stage of FIG. 3 does not need to be polished, because no other active devices will be fabricated on this surface.

Although embodiments of the invention have been discussed primarily with respect to specific embodiments thereof, other variations are possible. Various configurations of the described structure or process may be used in place of, or in addition to, the configurations presented herein. For example, additional layers of passivation and insulation may be disposed in-between described layers where appropriate.

Those skilled in the art will appreciate that the foregoing description is by way of example only, and is not intended to limit the invention. Nothing in the disclosure should indicate that the invention is limited to systems that are implemented on a single wafer. Nothing in the disclosure should indicate that the invention is limited to systems that require a particular form of semiconductor processing or integrated circuits. Nothing in the disclosure should limit the invention to semiconductor devices based on silicon. In general, any diagrams presented are only intended to indicate one possible configuration, and many variations are possible. Those skilled in the art will also appreciate that methods and systems consistent with the present invention are suitable for use in a wide range of applications encompassing semiconductor structures.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those skilled in the art, without departing from the spirit and scope of the present invention, which is more particularly set forth in the appended claims.

What is claimed is:

1. A method comprising:
forming a first wafer having a first bonding material;
forming a second wafer having a substrate, a SiGeBC layer, an active layer and a second bonding material, the active layer being between the SiGeBC layer and the second bonding material;
bonding the second wafer to the first wafer at the first and second bonding materials; and
removing the substrate using the SiGeBC layer as an etch stop.

2. The method of claim 1, wherein:
the forming of the second wafer includes forming the SiGeBC layer by epitaxial growth.

3. The method of claim 1, wherein:
the forming of the second wafer includes forming the SiGeBC layer by ion implantation.

4. The method of claim 1, wherein:
the forming of the second wafer includes forming the SiGeBC layer by a combination of epitaxial growth and ion implantation.

5. The method of claim 1, wherein:
the SiGeBC layer induces a strain in at least a portion of the active layer.

6. The method of claim 1, further comprising:
removing the SiGeBC layer.

7. The method of claim 1, wherein:
the forming of the second wafer includes forming the SiGeBC layer and the active layer prior to the bonding of the second wafer to the first wafer.

8. The method of claim 1, wherein:
the second wafer is a bulk silicon wafer.

9. The method of claim 1, wherein:
the active layer includes a gate and a channel; and
the bonding of the second wafer to the first wafer causes the gate to be between the channel and the first wafer.

10. The method of claim 1, wherein:
the forming of the first wafer includes forming a trap rich layer therein.

11. A method comprising:
forming a first wafer having a first bonding material;
forming a second wafer having a substrate, an etch stop layer, an active layer and a second bonding material, the active layer being between the etch stop layer and the second bonding material, the etch stop layer comprising silicon, germanium, and carbon;
bonding the second wafer to the first wafer at the first and second bonding materials; and
removing the substrate using the etch stop layer.

12. The method of claim 11, further comprising:
forming the etch stop layer by epitaxial growth of the silicon, germanium, and carbon.

13. The method of claim 11, further comprising:
forming the etch stop layer by ion implantation of the silicon, germanium, and carbon.

14. The method of claim 11, further comprising:
forming the etch stop layer by a combination of epitaxial growth and ion implantation of the silicon, germanium, and carbon.

15. The method of claim 11, further comprising:
removing the etch stop layer.

16. The method of claim 11, further comprising:
forming the etch stop layer and the active layer within the second wafer prior to bonding the first wafer to the second wafer.

17. A semiconductor structure comprising:
a first wafer;
a first bonding material at a surface of the first wafer;
a second wafer bonded to the first wafer;
an active layer within the second wafer; and
a second bonding material at a surface of the second wafer and being bonded to the first bonding material;
wherein a substrate has been removed from the second wafer on an opposite side of the active layer from the first wafer using a SiGeBC layer as an etch stop.

18. The semiconductor structure of claim 17, further comprising:
the SiGeBC layer as also a strain-inducing layer.

19. The semiconductor structure of claim 17, wherein:
the second wafer is a bulk silicon wafer prior to formation of the active layer and the SiGeBC layer therein.

20. The semiconductor structure of claim 17, wherein:
the active layer includes a gate and a channel, the gate being between the channel and the first wafer.

* * * * *